United States Patent
Fernandez

(10) Patent No.: US 10,176,905 B2
(45) Date of Patent: Jan. 8, 2019

(54) ELECTRICALLY CONDUCTIVE AND INSULATIVE COMPOSITE

(71) Applicant: Kitty Hawk Corporation, Mountain View, CA (US)

(72) Inventor: Ian Fernandez, Boulder Creek, CA (US)

(73) Assignee: Kitty Hawk Corporation, Mountain View, CA (US)

( * ) Notice: Subject to any disclaimer, the term of this patent is extended or adjusted under 35 U.S.C. 154(b) by 0 days.

(21) Appl. No.: 15/372,920

(22) Filed: Dec. 8, 2016

(65) Prior Publication Data

US 2018/0166183 A1 Jun. 14, 2018

(51) Int. Cl.
| | |
|---|---|
| H05K 9/00 | (2006.01) |
| H01B 7/02 | (2006.01) |
| B32B 15/04 | (2006.01) |
| H01B 13/06 | (2006.01) |

(52) U.S. Cl.
CPC .............. *H01B 7/02* (2013.01); *B32B 15/04* (2013.01); *H01B 13/06* (2013.01); *H05K 9/0086* (2013.01); *H05K 9/0098* (2013.01); *B32B 2307/212* (2013.01)

(58) Field of Classification Search
CPC .................................................... H05K 9/0098
See application file for complete search history.

(56) References Cited

U.S. PATENT DOCUMENTS

| | | | |
|---|---|---|---|
| 3,466,382 A | * | 9/1969 | Rocklitz ............... H02G 5/005 174/117 FF |
| 4,602,121 A | | 7/1986 | Priaroggia |
| 5,578,384 A | | 11/1996 | Kingston |
| 5,797,239 A | | 8/1998 | Zaccone |
| 6,114,050 A | | 9/2000 | Westre |
| 7,115,323 B2 | | 10/2006 | Westre |

(Continued)

FOREIGN PATENT DOCUMENTS

| | | |
|---|---|---|
| CN | 105931700 | 9/2016 |
| EP | 1089300 | 4/2001 |
| WO | WO2014199848 | 12/2014 |

OTHER PUBLICATIONS

Hundley et al. Multi-Scale Modeling of Metal-Composite Interfaces in Titanium-Graphite Fiber Metal Laminates Part I: Molecular Scale. Open Journal of Composite Materials, 2011, pp. 19-37. doi:10.4236/ojcm.2011.11003 Published Online Oct. 2011 (http://www.SciRP.org/journal/ojcm).

*Primary Examiner* — Hung V Ngo
(74) *Attorney, Agent, or Firm* — Van Pelt, Yi & James LLP

(57) ABSTRACT

An electrically conductive and insulative composite (ECIC) is disclosed. In various embodiments, an ECIC as disclosed herein may include an electrically conductive structural element and one or more electrically insulative structural elements adhesively bonded to the conductive structural element to form a unitized structure having a design shape and one or more significant mechanical properties. The conductive structural element is substantially encapsulated by said one or more electrically insulative structural elements with the exception of one or more contact areas comprising portions of conductive material not encapsulated by said one or more electrically insulative structural elements.

20 Claims, 6 Drawing Sheets

(56) References Cited

U.S. PATENT DOCUMENTS

| | | | |
|---|---|---|---|
| 7,557,298 B2 * | 7/2009 | Vanhoutte | H02G 5/005 174/149 B |
| 7,943,076 B1 | 5/2011 | Hawkins | |
| 9,079,382 B2 | 7/2015 | Marttila | |
| 2004/0020685 A1 * | 2/2004 | Page | H02G 5/066 174/137 R |
| 2010/0314021 A1 | 12/2010 | Safari Zadeh | |

* cited by examiner

ELECTRICALLY CONDUCTIVE AND INSULATIVE COMPOSITE

BACKGROUND OF THE INVENTION

Fiber reinforced polymer (FRP), also known as fiber reinforced plastic, is a composite material comprising a polymer matrix reinforced with fibers. Such composite materials have been used in a variety of applications in which their strength, rigidity, and other qualities (e.g., corrosion resistance) relative to their weight is considered to be advantageous. Examples include aerospace (e.g., satellites, manned space vehicles); aircraft (e.g., fuselage, wings, etc.), water craft (e.g., boat hulls), electric or other land vehicles (e.g., electric cars), and many non-transportation related uses, such as sports equipment.

One method to produce useful articles using FRP is to layer sheets of fiber cloth into a mold in the shape of the final product. The mold is filled with a polymer precursor and is heated (or exposed to ambient air) to cure the polymer. Alternatively, sheets of fiber cloth that have been pre-impregnated with polymer precursor may be draped over a mold in the shape of the final product and then the polymer cured by heat or air. Pressure may be applied to eliminate (or reduce) air bubbles between layers, to increase strength of the resulting product.

In some cases, non-FRP layers have been sandwiched in between FRP layers, e.g., to increase strength, flexibility, or other attributes. For example, titanium-graphite fiber metal laminates may be formed by adhesively bonding thin metal (in this case titanium) layers (e.g., thin foil) to (e.g., between) traditional FRP layers.

In some applications, composite materials may be reinforced by other structures. For example, a boat hull may be reinforced by skeletal structures, such as a keel, frames (ribs), etc. In the case of an aircraft, a metal or other frame may be used. A wing made of composite material, for example, may be reinforced with structures such as spars (extending outward along a span of the wing) and ribs (often align with a direction of flight, e.g., to increase strength and to define and maintain an airfoil shape of the wing).

In some applications, e.g., aircraft or other vehicles, it may be necessary to run cables through composite structures, e.g. to provide power to a motor (e.g., to drive a propeller, lift fan, drive shaft, etc.) and/or to carry control and/or sensor signals.

BRIEF DESCRIPTION OF THE DRAWINGS

Various embodiments of the invention are disclosed in the following detailed description and the accompanying drawings.

DETAILED DESCRIPTION

Figure 1:
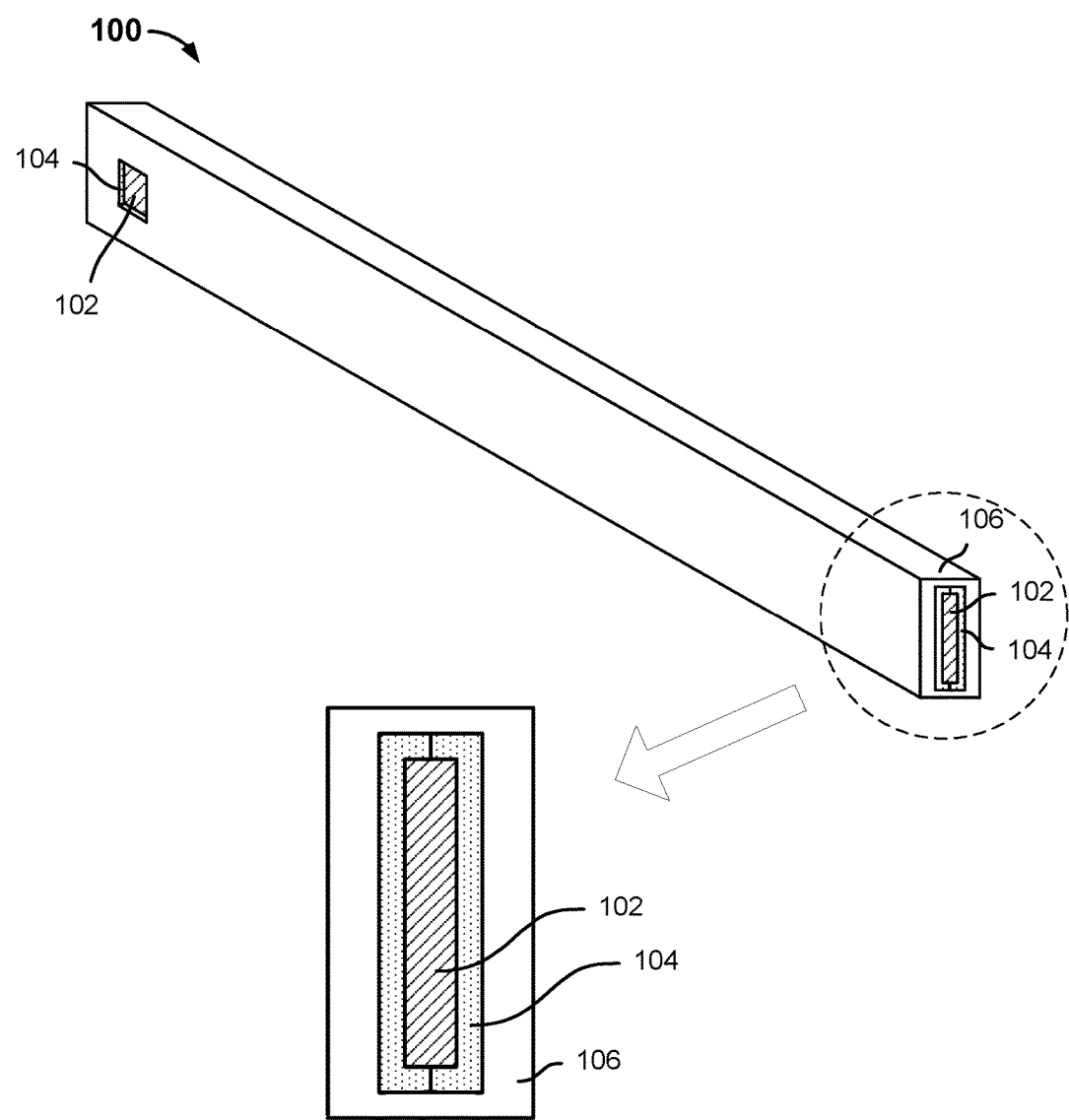
FIG. 1 is a diagram illustrating an embodiment of an electrically conductive and insulative composite.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A reinforced fiber composite embedded with one or more insulated electrical conductors is disclosed. In various embodiments, electrical conductors are adhesively bonded to and encapsulated by fiber reinforced polymer (or other) electrical insulators. The conductors provide conductive bus bars from one location in the structure to another and may improve structural stiffness, strength, or other mechanical properties at a system level. The insulators protect surrounding objects from any potential voltage in the conductors and may improve structural properties at the system level. Additional fiber reinforced polymer structure of any electrical impedance may encapsulate the insulators. The combined structure can form any shape needed for the purposes of the specific system.

Examples of applications/uses of electrically conductive and insulative composites as disclosed herein include without limitation the following:

In some embodiments, a carbon fiber reinforced polymer C-section aircraft spar is laminated with fiberglass reinforced insulation layers covering one or more aluminum conductive layers, each with tabs (or other structures) at two locations or more to enable electrical current to be transmitted between said locations.

In some embodiments, a carbon fiber reinforced polymer quad copter fan support tube is laminated with fiberglass reinforced insulation layers covering one or more aluminum conductive layers, each with tabs (or other structures) at two locations or more to enable electrical current to be transmitted between said locations, e.g., from the fuselage to an electric motor that drives a lift fan mounted on the fan support tube.

In some embodiments, a carbon fiber reinforced polymer electric car chassis is laminated with fiberglass reinforced insulation layers covering one or more aluminum conductive layers, each with tabs (or other structures) at two locations or more to enable electrical current to be transmitted between said locations, in this case between the batteries/motor controllers, and electric motor(s).

In various embodiments, electrical connections may be made via tabs or other conductive structures extending from said conductors to the exterior of the structure. The tabs (or other structure) can be electrically bonded to by conventional means: solder, spot weld, braze, bolting. In various embodiments, for connections in the field or acreage of a structure, said insulators and additional structural materials can be omitted locally allowing access to said conductor.

FIG. 1 is a diagram illustrating an embodiment of an electrically conductive and insulative composite. In the example shown, electrically conductive and insulative composite (ECIC) structure 100 includes a conductor 102, e.g., an aluminum or other conductive bar. The conductor 102 is encased by electrically insulative layers 104. In this example, the conductor 102 is sandwiched between complementary sections of insulative material 104. In some embodiments, insulative material 104 may comprise an electrically insulative fiber reinforced polymer material, such as fiberglass. In some embodiments, insulative material 104 may have high electrical impedance (i.e., insulative) and may have mechanical and/or other properties that may be significant at the system level (i.e., a system into which the ECIC structure 100 has been integrated). For example, the insulative material 104 may contributed to defining the shape of ECIC structure 100 and/or to mechanical properties such as rigidity and strength.

The conductor 102 and insulative layer 104 are encapsulated in one or more layers comprising FRP or other composite material 106. In some embodiments, non-composite layers may be included, e.g., conductive or non-conductive layers included to enhance/alter one or more physical properties of the resulting overall ECIC structure 100.

Referring further to FIG. 1, at the left end of the ECIC structure 100, as shown, a portion of conductor 102 is exposed, e.g., to provide a location at which an electrical contact/connection may be made. In some embodiments, the opening may be made by forming a structure 100 without the opening and then selectively removing outer composite material 106 and/or insulative material 104 (e.g., through chemical or mechanical etching, or other techniques) to expose the conductor 102 at a prescribed location and/or to a prescribed extent. In other embodiments, the opening may be formed my omitting FRP layers in the area of the connection. In various embodiments, electrical contact may be made through any suitable technique, including without limitation by solder, spot weld, braze, bolting, or conductive adhesive.

In various embodiments, locations to make electrical contact to a conductor comprising an ECIC structure, such as ECIC structure 100 of FIG. 1, may be provided at opposite ends of, or any two or more arbitrary locations on, an ECIC structure. For example, in the case of the ECIC structure 100 of FIG. 1, in addition to the electric contact site shown on the left side of ECIC structure 100 (as shown) a corresponding electric contact site may be provided at an opposite (e.g., right as shown) end of the ECIC structure 100. By making electrical contact at such opposite (or other) locations, an electrical and/or electronic voltage, current, and/or signal may be transmitted via the conductor 102.

In some embodiments, pairs of conductors insulated electrically from each other may be integrated into an ECIC structure such as ECIC structure 100 of FIG. 1, enabling an electrical circuit to be completed. For example, a battery at one end of ECIC structure 100 may be used to power a motor at an opposite end by connecting the positive and negative terminals of the battery to different ones of a pair of conductors comprising the ECIC structure and connecting corresponding motor leads to the opposite ends of the respective conductors comprising the ECIC structure.

In various embodiments, ECIC structures disclosed herein may be formed in any desired shape, composition, and/or size. One or more of the shape, composition, and size may be dictated by requirements of a system (e.g., larger assembly) into which an ECIC structure as disclosed herein is to be integrated. For example, beams, spars, or other elongated structures may be formed of any desired length and/or cross-sectional shape (e.g. "I", "C", "T", or other cross sections).

Figure 2A:
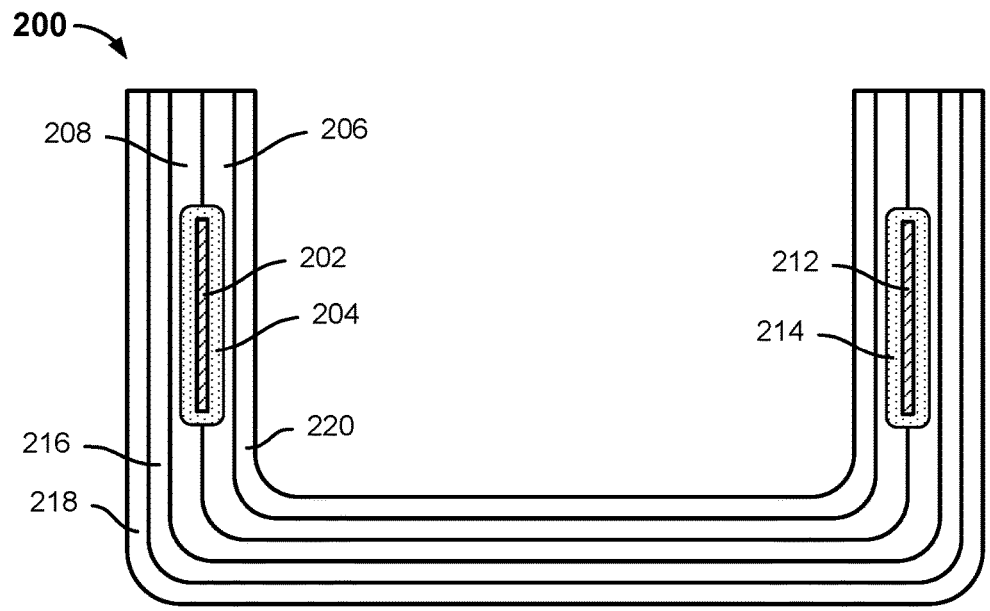
FIG. 2A is a diagram illustrating an embodiment of an electrically conductive and insulative composite.

FIG. 2A is a diagram illustrating an embodiment of an electrically conductive and insulative composite. In the example shown, ECIC structure 200 is shown in cross section to have a "C" (or "U") cross section having left/right (as shown) "cap" sections joined by a horizontally oriented (as shown) "web" section. ECIC structure 200 is shown to have a pair of conductive bars 202, 212, e.g., aluminum bars, encapsulated in the left and right cap sections, respectively. Each of the conductive bars 202, 212 is encased in insulative material 204, 214. The insulated bars (202/204, 212/214) in turn are sandwiched between composite layers 206 and 208, which in turn are enclosed within additional composite (or other) layers 216, 218, and 220.

In various embodiments, one or more layers other than the conductive bars 202, 212 and/or insulative material 204, 214, such as layers 206, 208, 216, 218, and/or 220, may have desired mechanical, electrical, and/or other properties. For example, in some embodiments, such additional layers may be selected at least in part to satisfy a design requirement in terms of the overall mechanical strength of the ECIC structure 200. In some embodiments, one or more layers may comprise an electrically grounded and adhesively (or otherwise) bonded electromagnetic interference (EMI) shielding element, such as a copper mesh, stainless steel mesh, or other grounded shielding. In various embodiments, additional layers (i.e., other than conductive and insulative materials may have any electrical impedance.

Figure 2B:
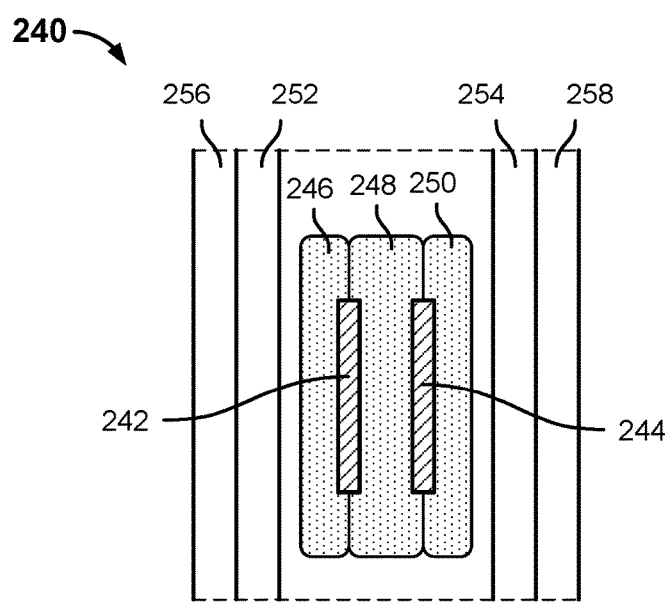
FIG. 2B is a diagram illustrating an embodiment of an electrically conductive and insulative composite.

FIG. 2B is a diagram illustrating an embodiment of an electrically conductive and insulative composite. In the example shown, ECIC structure 240 is shown in partial cross section to include conductors 242 and 244, e.g., aluminum or other conductive bars, encased in insulative layers 246, 248, and 250. In various embodiments, insulative layers 246, 248, and 250 may be bonded adhesively to and around conductors 242 and 244, and to each other in regions were conductors 242 and 244 are not present, to fully encapsulate conductors 242 and 244, except in regions in which portions of conductors 242 and/or 244 may be left exposed, e.g., to be able to make electrical connection to one or the other of conductor 242 and conductor 244. In the example shown, the combined insulative and conductive layers/material (242, 244, 246, 248, and 250) are sandwiched between additional composite layers 252, 254, 256, and 258, to provide a structure 240 of a design/desired size and shape and having mechanical and/or other properties that satisfy design requirements, such as strength and rigidity.

ECIC structures disclosed herein may be used in any application in which the mechanical properties of a composite structure (strength, rigidity, light weight, etc.) may be advantageous and in which enhanced strength and electrical conductivity provided by integrated conductive and insulative materials as disclosed herein may be useful. For example, spars, frames, ribs, and other shapes may be formed as ECIC structures as disclosed herein, and used to reinforce other composite structures while providing a way to transmit electrical power and/or signals via the conductors included in the ECIC structure.

Figure 3A:
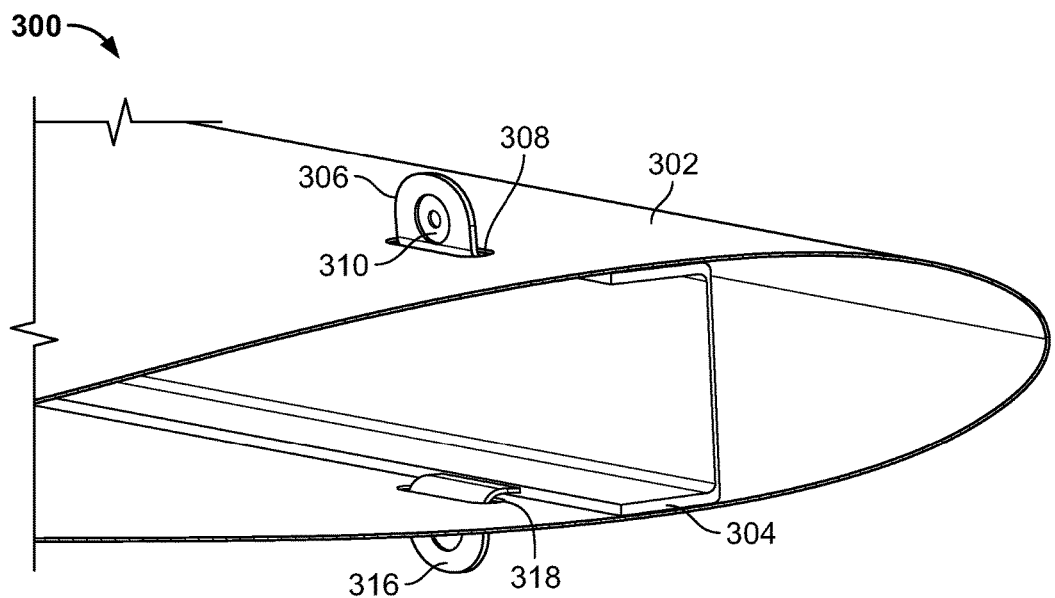
FIG. 3A is a diagram illustrating an embodiment of an airfoil that includes an electrically conductive and insulative composite structure.

FIG. 3A is a diagram illustrating an embodiment of an airfoil that includes an electrically conductive and insulative composite structure. In the example shown, airfoil (e.g., wing) 300 includes an outer shell 302, comprising a FRP or other composite material, reinforced by an ECIC spar 304 having a "C" cross section and positioned near and along a leading edge of an airfoil shape defined by outer shell 302. In the example shown, a tab 306 associated with an upper cap (as shown) of spar 304 extends through a slot shaped opening 308 in outer shell 302. Tab 306 comprises insulative material around a selectively exposed conductor 310. In various embodiments, conductor 310 may comprise an integral, tab shaped extension of a conductive bar (not shown in FIG. 3A) that is encapsulated within an upper cap portion of ECIC spar 304 and extends at least part of the length of ECIC spar 304.

A lower tab 316 of ECIC spar 304 is shown to extend likewise through a lower slot shaped opening 318 through an underside of outer shell 302. In various embodiments, lower tab 316 may expose locally a portion of conductive material (not shown), e.g., to enable electrical contact to be made to a conductive bar or other conductive material encapsulated in the lower cap portion of ECIC spar 304.

In various embodiments, tabs 306 and 316 may enable electrical connections to be made at a near (right as shown) or inboard end of airfoil 300, for example to transmit electrical power to a motor at a distal end (not shown in FIG. 3A) of ECIC spar 304 and/or airfoil 300.

Figure 3B:
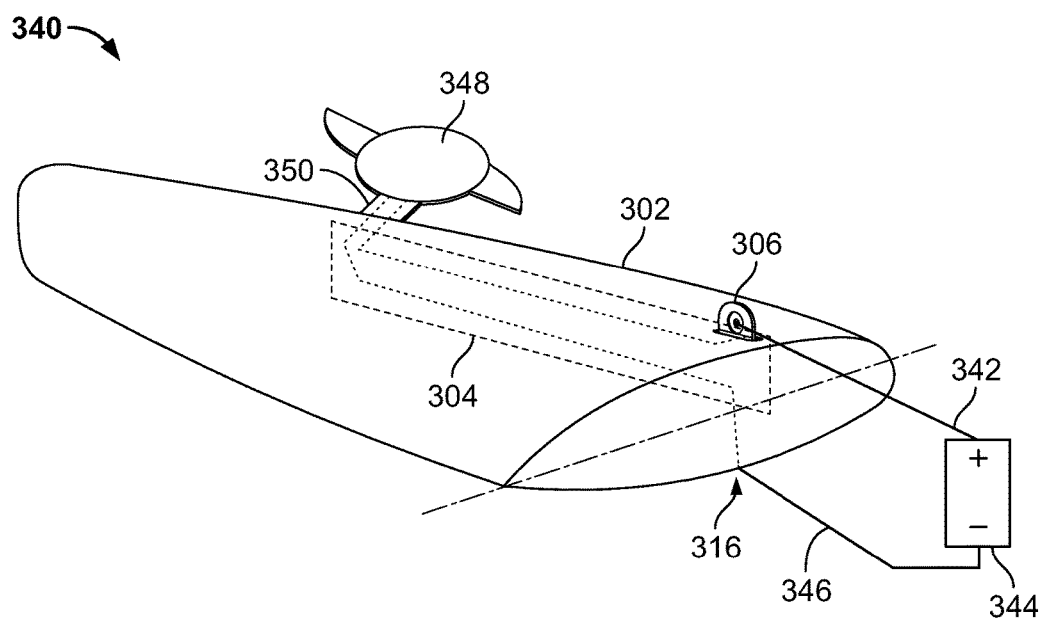
FIG. 3B is a diagram illustrating an embodiment of a multicopter aircraft that includes airfoil comprising an electrically conductive and insulative composite structure.

FIG. 3B is a diagram illustrating an embodiment of a multicopter aircraft that includes an airfoil comprising an electrically conductive and insulative composite structure. In various embodiments, the wing (airfoil) 340 of FIG. 3B may correspond to and/or comprise an instance or example of an airfoil such as airfoil 300 of FIG. 3A. In the example shown, airfoil 340 is shown to include an ECIC spar 304, such the one shown in FIG. 3A, with a tab 306 extending through an outer shell 302, as in FIG. 3A. A lower tab 316 extends through a lower slot shaped opening (not shown in FIG. 3B) through the underside of outer shell 302 of airfoil 340.

In the example shown in FIG. 3B, an electrical connection 342 is shown to have been made from a positive terminal of a battery 344 to an exposed conductor portion of tab 306, and thereby to a conductive bar or other conductive bus encapsulated in an upper cap portion of spar 304. Similarly, an electrical connection 346 is shown between a negative terminal of battery 344 via lower tab 316 to a conductive material encapsulated in a lower cap portion of spar 304. At the outboard (left, as shown) end of airfoil 340 and spar 304, electrical contact is made to an electric motor associated with a lift fan (or other rotor) 348, in this example via wires running through a boom structure 350 on which lift fan 348 and its associated motor are mounted.

The arrangement shown in FIG. 3B enables the conductive material used to provide electrical power to the motor that drives lift fan 348 to be provided at least in substantial part via conductive material comprising ECIC spar 304. The conductive material may provide improved/desired mechanical properties, e.g., increased strength, rigidity, and durability, in ECIC spar 304 and the system (in this case airfoil 340) into which ECIC spar 304 is integrated. Use of the conductive material in ECIC spar 304 to transmit power eliminates the need to run wires or cables through airfoil 340 along the length of ECIC spar 304, which may reduce overall weight while achieving desired structural properties.

Figure 3C:
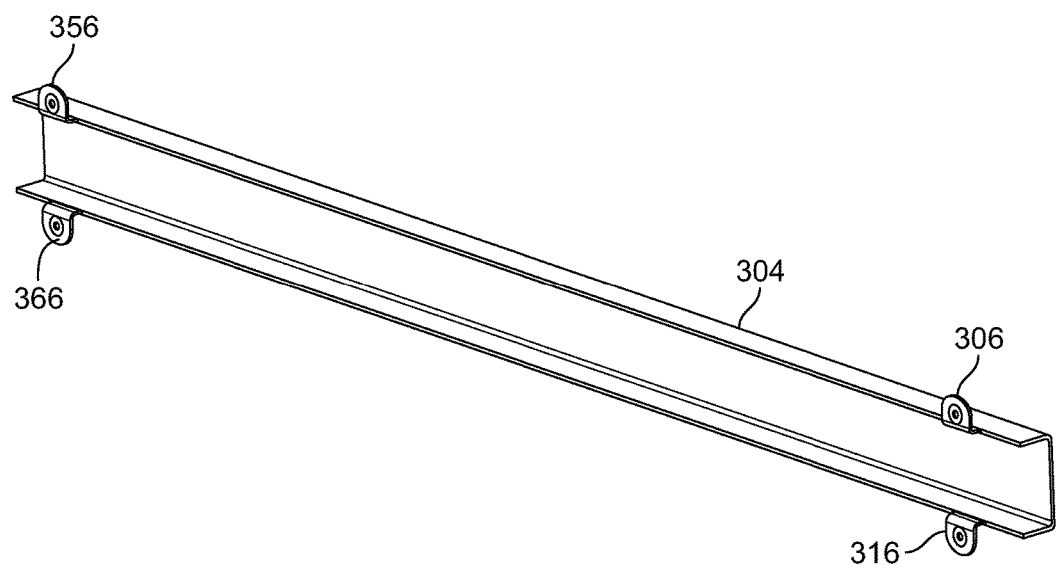
FIG. 3C is a diagram illustrating an embodiment of an electrically conductive and insulative composite structure to provide structural support to and electrical connectivity through an airfoil.

FIG. 3C is a diagram illustrating an embodiment of an electrically conductive and insulative composite structure to provide structural support to and electrical connectivity through an airfoil. In the example shown, ECIC spar 304 of FIGS. 3A and 3B is shown to include at a distal (left, as shown) end an upper tab 356 corresponding to upper tab 306 on the near (inboard) end, and a lower tab 366 corresponding to lower tab 316 on the near end. In various embodiments, electrical power and/or signals may be transmitted via one or both of an upper conductive bus associated with tabs 306 and 356 and a lower conductive bus associated with tabs 316 and 366.

Figure 3D:
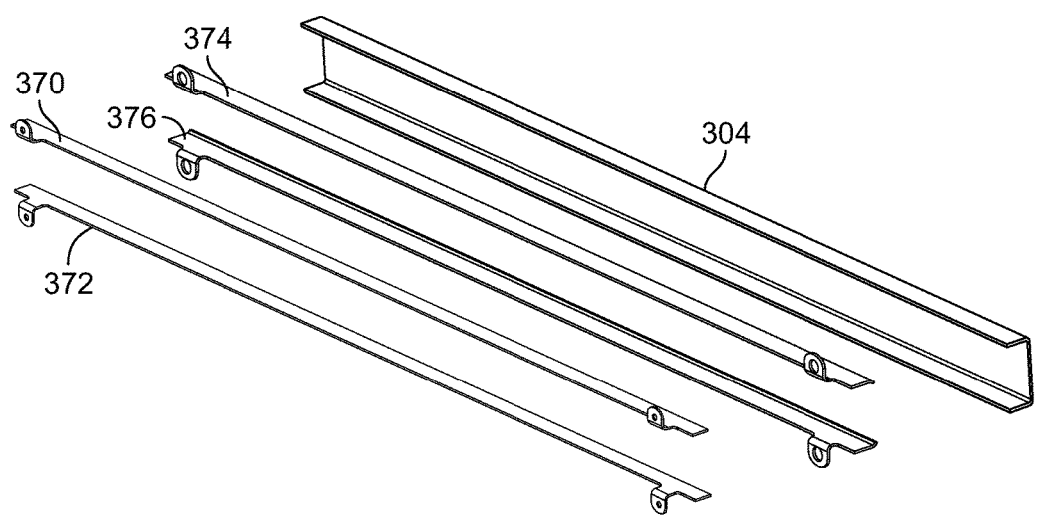
FIG. 3D is a diagram showing an exploded view of an embodiment of an electrically conductive and insulative composite structure to provide structural support to and electrical connectivity through an airfoil.

FIG. 3D is a diagram showing an exploded view of an embodiment of an electrically conductive and insulative composite structure to provide structural support to and electrical connectivity through an airfoil. Specifically, in FIG. 3D an exploded and/or major component view of ECIC spar 304 of FIGS. 3A, 3B, and 3C is shown. ECIC spar 304 is shown to include an upper conductive bar 370 and a lower conductive bar 372, each having tabs corresponding to conductive portions of tabs 356, 306 and tabs 366, 316, respectively. In some embodiments, conductive bars 270, 272 may comprises aluminum bars approximately 0.02 inches thick and 2 inches wide. ECIC spar 304 is shown to further include upper insulative material 374 and lower insulative material 376, in various embodiments each comprising material that is adhesively or otherwise bonded to a corresponding of said conductive bars 370, 372, to encapsulate the conductive bars 370, 372 except in locations on said tabs at which the insulative material is locally omitted to facilitate electrical contact being made to the encapsulated conductive bars 370, 372. The insulated conductive bars (370, 374 and 372, 376) in turn are sandwich between additional composite and/or other layers comprising ECIC spar 304, to provide an integrated structure as shown in FIG. 3C.

Figure 3E:
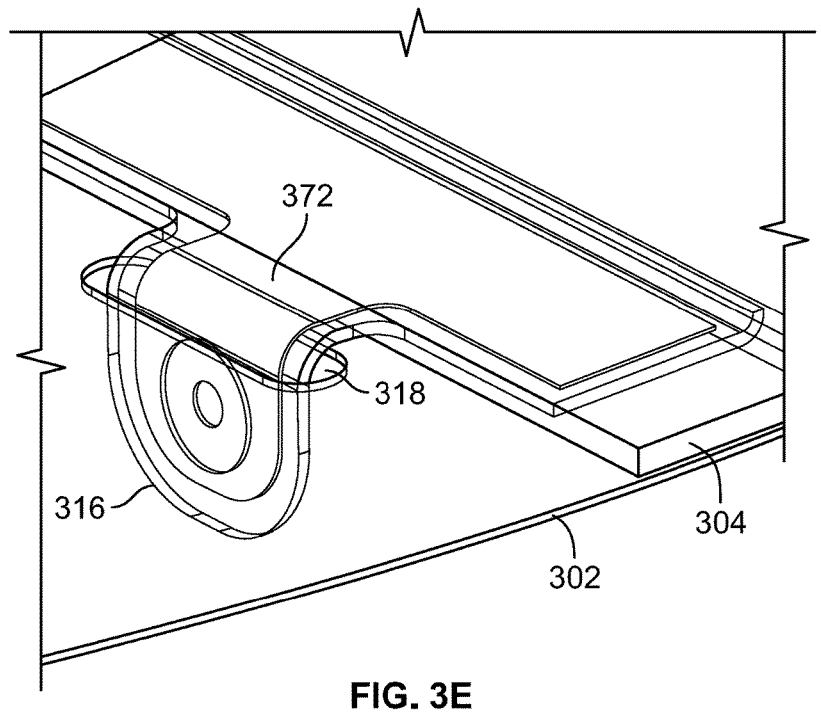
FIG. 3E is a diagram illustrating a connector tab portion of an electrically conductive and insulative composite structure to provide structural support to and electrical connectivity through an airfoil.

FIG. 3E is a diagram illustrating a connector tab portion of an electrically conductive and insulative composite structure to provide structural support to and electrical connectivity through an airfoil. In the view shown, lower tab 316 of ECIC spar 304 is shown comprising insulative material that encapsulates a tab portion of lower conductive bar 372 that extends from a near (as shown) end of a lower cap portion of ECIC spar 304 and bends downward to extend through lower slot shaped opening 318 of outer shell 302.

Figure 3F:
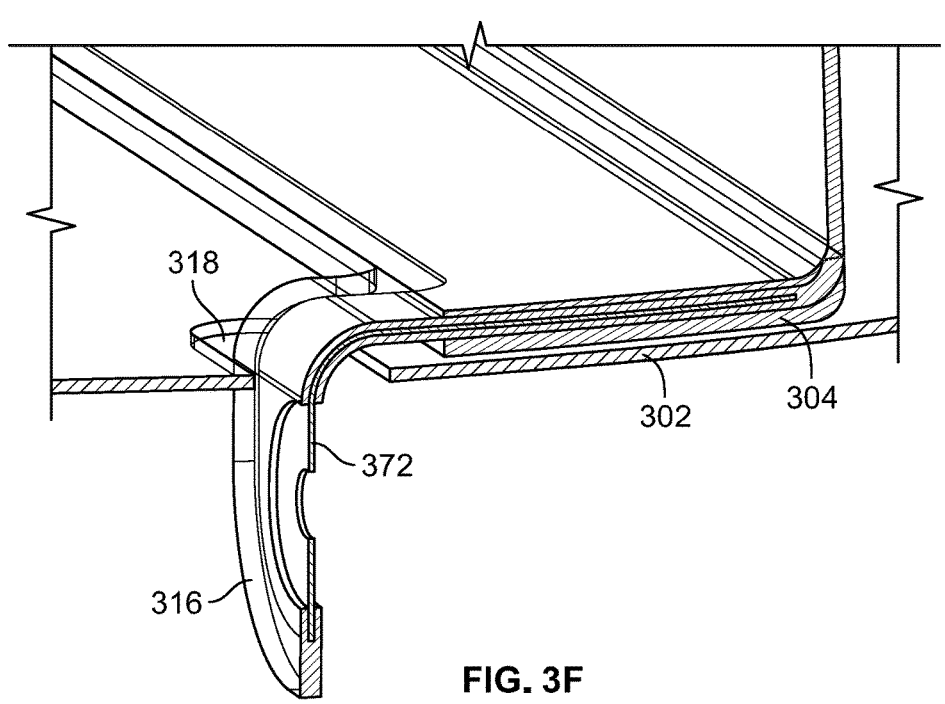
FIG. 3F is a diagram showing a cross-sectional view of a connector tab portion of an electrically conductive and insulative composite structure to provide structural support to and electrical connectivity through an airfoil.

FIG. 3F is a diagram showing a cross-sectional view of a connector tab portion of an electrically conductive and insulative composite structure to provide structural support to and electrical connectivity through an airfoil. In the cross sectional view shown, tab 316 is seen to include insulative material that encases the tab portion of lower conductive bar 372 except in a region in the middle of the tab 316, to enable electrical contact to be made to lower conductive bar 372 via the exposed conductor comprising tab 316.

While electrical contact to conductive material included in an ECIC structure is made via tabs extending from the ECIC structure in the examples shown in FIGS. 3A-3F, in various embodiments electrical contact may be made via other structures and techniques, such as posts or other non-tab structures extending from the ECIC structure and/or via conductive material exposed by removing encapsulated material, such as by chemical or mechanical techniques, and/or by forming the ECIC encapsulating layers in a manner that leaves a portion of the conductive material exposed.

Figure 4:
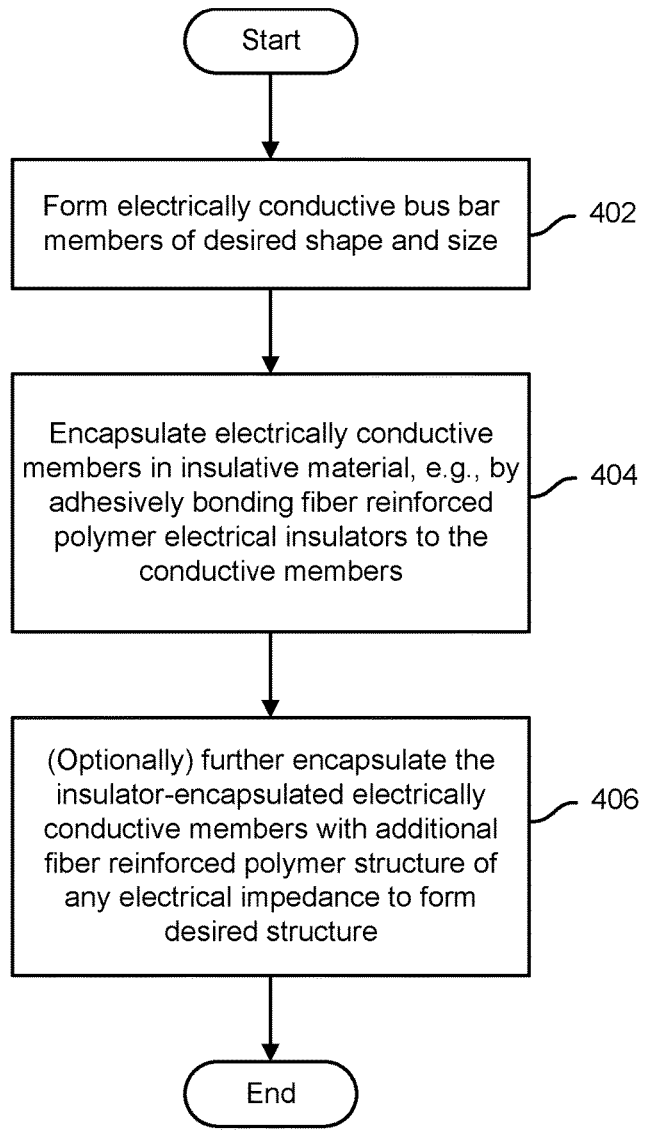
FIG. 4 is a flow chart illustrating an embodiment of a process to fabricate an electrically conductive and insulative composite.

FIG. 4 is a flow chart illustrating an embodiment of a process to fabricate an electrically conductive and insulative composite. In various embodiments, the process of FIG. 4 may be used to fabricate an ECIC structure, such as ECIC spar 304 of FIGS. 3A-3F. In the example shown, electrically conductive bus bars (or other electrically conductive structures having design electrical and/or mechanical properties) are formed in a desired size and shape (402). The electrically conductive elements are encapsulated in insulative material (404), e.g., by adhesively bonding FRP or other electrically insulative elements to the conductive members. The electrically insulative elements may comprise fiberglass, innegra, or other insulative composite elements have a size and shape that conforms to and/or otherwise complements at least corresponding portions of an electrically conductive element to which the insulative element is to be bonded.

The insulator members may be encapsulated within one or more FRP composite and/or other layers, of any desired electrical impedance, to form an ECIC structure of a desired shape and size and/or having desired electrical, mechanical, and/or other properties. For example, additional layers may be formed in the shape of a "C" cross-section spar, such as ECIC spar 304 of FIGS. 3A-3F.

Electrically conductive and insulative composite (ECIC) structures have been disclosed. In various embodiments, an ECIC structure as disclosed herein may combine high voltage bus bar conductors and fiber reinforced polymer composite structure into a unitized electro structural system. In various embodiments, ECIC structures may include just one or more conductors and insulators, or they may be augmented with conventional fiber reinforced polymers of any electrical impedance to form additional structure.

Relative to composite electric vehicle chassis or other ground, air, or water composite electric vehicles, which typically are strung with conventional power cables, ECIC can provide mass (weight) reductions while potentially increasing mechanical properties of the structure. This benefit may be highly relevant in aerial vehicles, which must be made as light as possible, but also applies to ground and water vehicles. Electric aircraft and distributed power vertical takeoff and landing (VTOL) systems may benefit from the ECIC technology disclosed herein, as VTOL systems require stiff ultra-lightweight structures. ECIC may be used in a wide variety of applications, including uses beyond those mentioned specifically herein, to replace parasitic electric cable mass with useful structural mass by utilizing the conductors are structural elements. In various embodiments, ECIC structures also may yield a reduction in vehicle level part count which typically leads to reduced manufacturing and operating costs.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An electrically conductive and insulative composite structure, comprising:
   a first cap section including:
      an electrically conductive structural element; and
      one or more electrically insulative structural elements comprising an electrically insulative composite material adhesively bonded to the conductive structural element to form a rigid unitized structure having a design shape and one or more significant mechanical properties, including rigidity and strength;
      wherein the conductive structural element is substantially encapsulated by said one or more electrically insulative structural elements with the exception of one or more contact areas comprising portions of conductive material not encapsulated by said one or more electrically insulative structural elements;
   a web section perpendicular to the first cap section and joined to the first cap section.

2. The composite structure of claim 1, wherein said conductive structural element comprises an electrically conductive metal.

3. The composite structure of claim 1, wherein said electrically insulative composite material includes fiber-reinforced polymer material.

4. The composite structure of claim 3, wherein said electrically insulative composite material comprises one or more of fiberglass or innegra.

5. The composite structure of claim 3, wherein said electrically insulative composite material has one or more mechanical properties that contribute to satisfying a design requirement of a system in which the electrically conductive and insulative composite structure is designed to be integrated.

6. The composite structure of claim 1, further comprising one or more additional structural elements bonded to said one or more electrically insulative structural elements.

7. The composite structure of claim 6, wherein one or more of said additional structural elements comprises a composite layer.

8. The composite structure of claim 6, wherein one or more of said additional structural elements comprises an electromagnetic shielding element.

9. The composite structure of claim 6, wherein said electrically conductive structural element, said one or more electrically insulative structural elements, and said one or more additional structural elements comprise a single unitized structure having a design shape and one or more significant mechanical properties.

10. The composite structure of claim 1, wherein one or more of said electrically conductive structural elements each includes at least two contact areas separated by a distance enabling a flow of electrical current between said contact areas.

11. The composite structure of claim 1, wherein said contact areas comprise portions of conductive material that are exposed by removing or omitting encapsulating material.

12. The composite structure of claim 1, wherein said contact areas comprise portions of conductive material that extend away from a main body portion of said electrically conductive structural element.

13. The composite structure of claim 1, wherein said electrically conductive structural element comprises a first electrically conductive structural element and further comprising a second electrically conductive structural element, electrically isolated from said first electrically conductive structural element, each of the first and second electrically conductive structural elements having a pair of contact areas, one at each of two locations separated by a distance, enabling an electrical circuit to be made of which the first electrically conductive structural element and the second electrically conductive structural element comprise low impedance segments.

14. The composite structure of claim 1, wherein said significant mechanical properties include one or more of a design rigidity, durability, flexibility, maximum load, and strength.

15. The composite structure of claim 1, further comprising a second cap section substantially parallel to the first cap section and joined to the first cap section by the web section.

16. A method to manufacture an electrically conductive and insulative composite structure, comprising:
    forming a first cap section including by:
        forming an electrically conductive structural element; and
        bonding one or more electrically insulative structural elements comprising fiber-reinforced polymer material adhesively to the conductive structural element to form a rigid unitized structure having a design shape and one or more significant mechanical properties, including rigidity and strength;
        wherein the conductive structural element is substantially encapsulated by said one or more electrically insulative structural elements with the exception of one or more contact areas comprising portions of conductive material not encapsulated by said one or more electrically insulative structural elements;
    forming a web section perpendicular to the first cap section; and
    joining the web section to the first cap section.

17. The method of claim 16, further comprising bonding one or more additional structural elements comprising fiber-reinforced polymer material to said one or more electrically insulative structural elements.

18. The method of claim 16, wherein said conductive structural element comprises a conductive bar or bus having an associated mechanical strength and rigidity.

19. The method of claim 16, wherein said insulative structural elements comprise an electrically insulative composite material.

20. The method of claim 16, further comprising forming in each of one or more of said electrically conductive structural elements at least two contact areas separated by a distance enabling a flow of electrical current between said contact areas.

* * * * *